United States Patent
Boydston et al.

[19]

[11] Patent Number: 5,872,017
[45] Date of Patent: Feb. 16, 1999

[54] IN-SITU EPITAXIAL PASSIVATION FOR RESISTIVITY MEASUREMENT

[75] Inventors: Mark R. Boydston, Vancouver, Wash.; Dena C. A. Mitchell, Portland, Oreg.

[73] Assignee: SEH America, Inc., Vancouver, Wash.

[21] Appl. No.: 787,244

[22] Filed: Jan. 24, 1997

[51] Int. Cl.⁶ .................................................. H01L 21/66
[52] U.S. Cl. .............................. 438/17; 438/934; 438/974
[58] Field of Search .............................. 438/17, 934, 974, 438/937, 448; 148/DIG. 146

[56] References Cited

U.S. PATENT DOCUMENTS

| | | | |
|---|---|---|---|
| 5,227,330 | 7/1993 | Agnello et al. | 438/495 |
| 5,373,806 | 12/1994 | Logar | 438/935 |
| 5,403,434 | 4/1995 | Moslehi | 438/906 |
| 5,578,504 | 11/1996 | Mitani et al. | 437/8 |

OTHER PUBLICATIONS

"Low–temperature in situ cleaning of silicon (100) surface by electron cyclotron resonance hydrogen plasma", Heung–Sik Tae, et al., *J. Vac. Sci Technol.*, vol. 13, No. 3, May/Jun. 1995, pp. 908–913.

"Standard Test Method for Determining Net Carrier Density Profiles in Silicon Wafers by Capacitance–Voltage Measurements With a Mercury Probe", *ASTM*, Designation: F 1392–93, pp. 601–613, 1993.

*Primary Examiner*—Michael Trinh
*Attorney, Agent, or Firm*—Bell Seltzer Intellectual Property Law Group of Alston & Bird LLP

[57] ABSTRACT

A method for preparing an epitaxial silicon wafer in a reactor is provided. The method comprises the steps of depositing an epitaxial layer on a surface of a silicon wafer contained in the reactor at an elevated temperature; purging the reactor with hydrogen after the epitaxial deposition; and cooling the reactor to an appropriate temperature which allows hydrogen passivation of the surface of the epitaxial layer. This prevents the formation of an oxide layer on the surface of the epitaxial layer for a sufficient amount of time to allow an accurate measurement of a carrier density profile of the epitaxial silicon wafer.

15 Claims, 3 Drawing Sheets

IN-SITU EPITAXIAL PASSIVATION FOR RESISTIVITY MEASUREMENT

BACKGROUND OF THE INVENTION

1. Area of the Art

The invention relates generally to resistivity measurement of silicon wafers, and more specifically to in-situ epitaxial passivation for improved resistivity measurement.

2. Description of the Prior Art

The net carrier density profiles in epitaxial and polished bulk silicon wafers are often determined by capacitance-voltage (C-V) measurements with a mercury (Hg) probe. The C-V measurement uses the differential capacitance of a depletion layer (whether by Schottky barrier or p-n junction) to determine the majority carrier-concentration profile as the space-charge-region width is changed by a reverse bias voltage.

The method of C-V measurements requires the formation of a Schottky barrier diode with a metal or mercury probe contact to an epitaxial or polished wafer surface. To conduct a capacitance-voltage measurement on an epitaxial silicon wafer having a silicon substrate wafer and an epitaxial layer, a metal or a mercury probe is formed on the surface of the epitaxial layer. When the metal, such as mercury, is brought into contact with a semiconductor, the conduction and valence bands of the semiconductor form a definite relationship. There then exists an energy barrier of a specific thickness—a depletion layer, which represents the energy needed to allow an electron in the metal to escape into the semiconductor. The depletion layer extends from the surface of the metal into the semiconductor, so that a depletion capacitance is formed. The majority carrier-concentration profile in an epitaxial or a polished bulk silicon wafer can then be measured by measuring the differential capacitance of the depletion layer.

The most common problem in capacitance-voltage measurements made with mercury probe instruments is a poor Schottky contact, which is generally indicated by an excessively high leakage current. The use of a poor Schottky contact does not actually prevent a carrier density determination but produces an erroneous result.

It is believed that one of the causes for the formation of a poor Schottky contact is the growth of an oxide layer on the surface of an epitaxial or polished bulk silicon wafer before the formation of the Schottky contact. Thus, in order to produce a reliable Schottky barrier diode, chemical treatment of the silicon surface may be required. A typical treatment of the silicon surface of a wafer requires the use of a chemical treatment with hydrofluoric acid (HF) followed with a deionized (DI) water rinse if the wafer is p-type, or the use of a chemical treatment with hydrofluoric acid followed with hydrogen peroxide treatment if the wafer is n-type.

The HF treatment allows hydrogen to attach to any dangling bonds on the surface of the wafer. This prevents oxygen from bonding, thus preventing growth of an oxide layer. However, such a chemical treatment creates an additional cost to the C-V measurement, and is also time consuming. In addition, the wet chemical process is also a cause for safety concerns.

Therefore, a need exists for providing a silicon wafer having a surface which allows an accurate C-V measurement to be taken without chemical treatments.

SUMMARY OF THE INVENTION

It is an object of the present invention to provide a silicon wafer having a surface which allows the formation of a good Schottky contact. In particular, it is an object of the present invention to provide a silicon wafer having a hydrogen passivated surface without a chemical treatment.

These and other objects are achieved by using novel methods for preparing an epitaxial silicon wafer in a reactor in accordance with the present invention. According to one aspect of the present invention, an epitaxial layer is deposited on a surface of a silicon wafer contained in a reactor at an elevated temperature, the reactor is purged with hydrogen after the epitaxial deposition, and then the reactor is cooled to a specified temperature which allows hydrogen passivation of the surface of the epitaxial layer. The formation of the hydrogen passivated surface prevents the formation of an oxide layer on the surface of the epitaxial layer for a sufficient amount of time to allow an accurate measurement of a carrier density profile of the epitaxial silicon wafer.

The methods of the present invention have been found to provide a number of advantages. As explained in greater detail below, the present invention provides a method of hydrogen-terminate the surface of an epitaxial silicon wafer to prevent the native oxide layer growth for a sufficient amount of time to allow an accurate measurement of a carrier density profile of the epitaxial silicon wafer without a chemical treatment. Therefore, the present invention eliminates the time and the cost for conducting a chemical treatment of the epitaxial silicon wafer surface before the measurement. Since the wet chemical process is eliminated, the methods of the present invention are safer to operate.

The methods of the present invention are well suited for use in preparing an epitaxial silicon wafer in a wafer reactor, particularly in an advanced semiconductor material reactor. They may also apply to a multiple wafer reactor. In preparing an epitaxial silicon wafer in accordance with the preferred embodiments of the present invention, an epitaxial layer is deposited on a surface of a silicon wafer contained in the reactor at an elevated temperature. After the epitaxial deposition, the reactor is purged with hydrogen. The reactor is then cooled down to a specified temperature which allows hydrogen passivation of the surface of the epitaxial layer such that the formation of an oxide layer on the surface of the epitaxial layer is prevented for a sufficient amount of time to allow an accurate measurement of a carrier density profile of the epitaxial silicon wafer. The epitaxial silicon wafer is then unloaded from the reactor at the specified temperature, and finally, the carrier density profile of the epitaxial silicon wafer is measured. In a preferred embodiment, the measurement is carried out by capacitance-voltage measurements with a mercury probe instrument.

The invention is defined in its fullest scope in the appended claims and is described below in its preferred embodiments.

DESCRIPTION OF THE FIGURES

The above-mentioned and other features of this invention and the manner of obtaining them will become more apparent, and will be best understood by reference to the following description, taken in conjunction with the accompanying drawings. These drawings depict only a typical embodiment of the invention and do not therefore limit its scope. They serve to add specificity and detail, in which.

DETAILED DESCRIPTION OF THE INVENTION

The present invention provides novel methods of preparing an epitaxial silicon wafer such that the silicon wafer has a hydrogen passivated surface allowing a capacitance-voltage (C-V) measurement without a chemical treatment.

Figure 1:
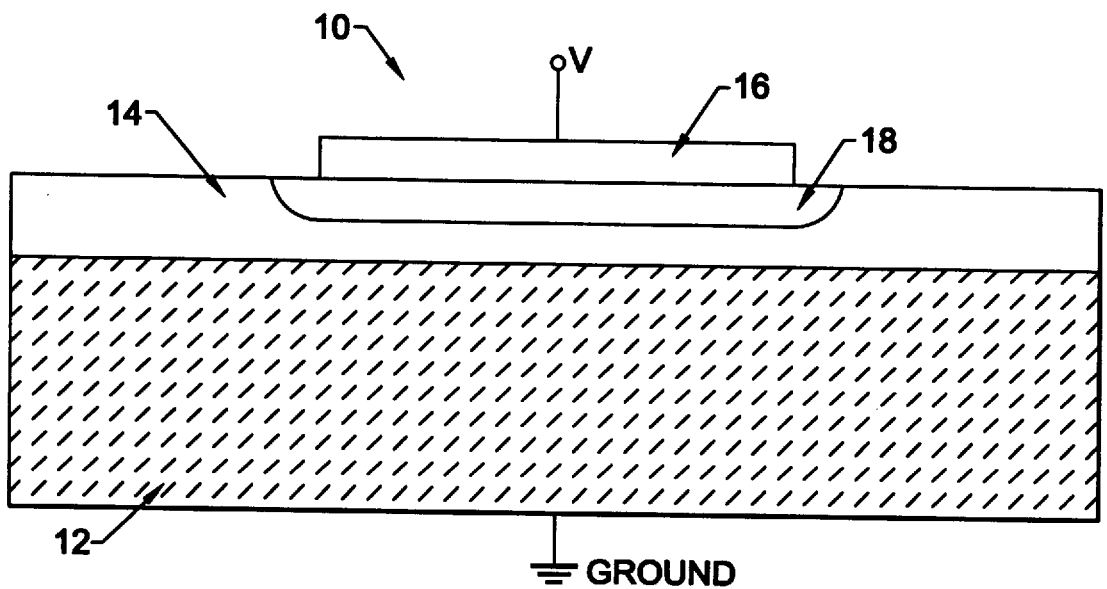
FIG. 1 is a block diagram showing a conventional capacitance-voltage measurement setup.

Referring to the conventional capacitance-voltage measurement setup of FIG. 1, in which a capacitance-voltage measurement is conducted on an epitaxial silicon wafer 10. The epitaxial silicon wafer 10 has a silicon substrate wafer 12 and an epitaxial layer 14. A metal or a mercury probe 16 is formed on the surface of the epitaxial layer 14. When the metal, such as mercury 16, is brought into contact with a semiconductor, the conduction and valence bands of the semiconductor form a definite relationship. There then exists an energy barrier of a specific thickness—a depletion layer 18, which represents the energy needed to allow an electron in the metal to escape into the semiconductor. The depletion layer 18 extends from the surface of the metal into the semiconductor, so that a depletion capacitance C is formed. The majority carrier-concentration profile in an epitaxial or a polished bulk silicon wafer can then be measured by measuring the differential capacitance of the depletion layer.

A conventional process of preparing an epitaxial silicon wafer in a reactor of a wafer handling section typically includes the following steps. First, a susceptor contained in the reactor for holding the silicon wafer is cleaned by etching off any remaining silicon from the previous wafer. Typically, the etching step is carried out by baking the susceptor in hydrogen at a temperature of about 1190° C. and then etching with anhydrous hydrogen chloride (HCl). After the clean up of the susceptor, a new silicon coating is deposited on the susceptor, and then the wafer is loaded into a process chamber of the reactor. The loading temperature is typically around 900° C. While the wafer is in the process chamber, the wafer is cleaned by an etching step. Typically, the surface of the wafer is baked in hydrogen at a temperature of about 1190° C. and etched with HCl to make it as clean as possible. After the surface of the silicon wafer is cleaned, the reactor is cooled to a deposition temperature of about 1150° C., and an epitaxial layer is deposited on the surface of the silicon wafer at the elevated temperature by passing process gases including silicon, dopant and hydrogen into the process chamber. Upon completion of the deposition, the process chamber of the reactor is purged with hydrogen, and is cooled down in hydrogen to about 900° C. The reactor continues to cool and holds until it is at about 900° C. Then the wafer is taken from the process chamber to a wafer handling chamber of the wafer handling section, where the wafer handling chamber is purged with nitrogen. The wafer is then flushed with nitrogen gas in the wafer handling chamber for approximately 45 seconds. During this time, the wafer cools from the unloading temperature to the ambient temperature. After the wafer is cooled to the ambient temperature, the wafer is removed from the wafer handling chamber to an ambient clean-room environment where it is placed into a cassette.

The current unloading temperature from a hydrogen environment to a nitrogen environment for an Advanced Semiconductor Materials (ASM) reactor, used in the conventional process just described, is about 900° C. Consequently when the wafer contacts the ambient environment, a native oxide layer is quickly formed. In order to measure the carrier density accurately, American Society for Testing and Materials (ASTM) procedures call for a hydrofluoric acid (HF) treatment to strip the native oxide layer and to hydrogen terminate the surface. This chemical treatment, however, creates an additional cost of the C-V measurement, and is also time consuming. In addition, the wet chemical process is also a cause for safety concerns.

Therefore, one of the primary objectives of the present invention is to provide a method for preventing the native oxide layer growth on the surface of the epitaxial layer for a sufficient amount of time to allow an accurate C-V measurement to be taken without chemical processing. This is achieved by observing that at a specific temperature, hydrogen passivation can occur on the surface of an epitaxial silicon wafer after the deposition of the epitaxial layer, and therefore the native oxide layer growth can be prevented for a sufficient amount of time to allow an accurate C-V measurement to be taken without chemical processing.

It is a surprising discovery of the present invention that while purging the reactor with hydrogen after the deposition of an epitaxial layer on the surface of a silicon wafer but before unloading the epitaxial silicon wafer, if the temperature of the reactor is controlled at an appropriate range, hydrogen passivation can occur on the surface of an epitaxial silicon wafer and therefore prevent the native oxide layer growth for a sufficient amount of time to allow an accurate C-V measurement to be taken without chemical processing. A temperature is appropriate if it allows the hydrogen to bond to the surface of the wafer due to minimal thermal energy. It is likely that the 900° C. unloading temperature has too much thermal energy to allow the hydrogen to bond to the surface of the wafer. A time is sufficient if an accurate C-V measurement can be taken.

Therefore, according to a preferred embodiment of the present invention, the conventional process of preparing an epitaxial silicon wafer in a reactor is modified. The new process comprises the steps of depositing an epitaxial layer on a surface of a silicon wafer contained in the reactor at an elevated temperature, purging the reactor with hydrogen after the epitaxial deposition, and cooling the reactor to a temperature of about or below about 500° C. before the epitaxial silicon wafer is unloaded from the reactor. Typically, the epitaxial layer is deposited at an elevated temperature of about 1150° C. The cooling of the reactor under hydrogen state from the deposition temperature of about 1150° C. to about or below 500° C. requires approximately 10 minutes to complete.

According to a preferred embodiment, after the epitaxial layer is deposited on a silicon wafer in a reactor, the reactor is purged with hydrogen, and is cooled down for about 10 minutes until the temperature of the reactor reaches about or below 300° C. Then the wafer is unloaded from the reactor to a wafer handling chamber purged with nitrogen and is cooled to an ambient temperature in the nitrogen state. The wafer is then moved to an ambient clean-room, placed into a cassette, and ready to be measured.

When the epitaxial silicon wafer is unloaded at a temperature of about or below 300° C., the epitaxial silicon wafer can be measured on a mercury probe up to 24 hours after the unloading of the wafer without a HF treatment.

In another preferred embodiment, the unloading temperature is about 500° C. The epitaxial wafer unloaded at about this temperature can be measured on a mercury probe up to about 10 minutes after the unloading of the wafer without a HF treatment.

The advantages of this invention are that a reliable and good Schottky contact is attainable without the need for chemical treatment of the wafer. This provides improved productivity by eliminating the time needed to perform the chemical treatment, as well as improving safety of the operation by eliminating chemical processing in this step altogether.

Figure 2:
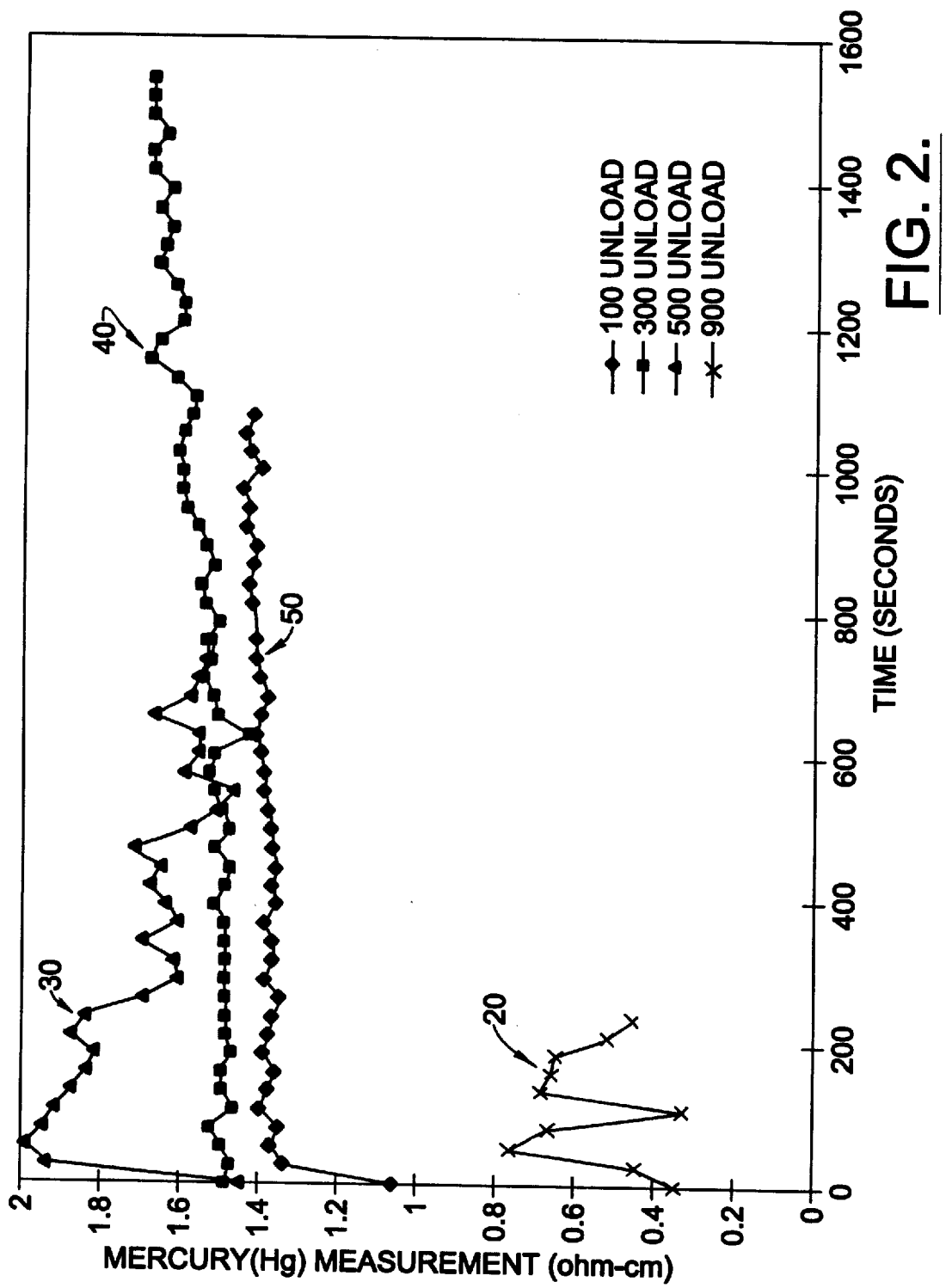
FIG. 2 is a diagram showing mercury (Hg) probe measurements as a function of the time during which the measurement takes place on epitaxial silicon wafers unloaded at variable unloading temperatures. The diagram compares the Hg probe measurements in the setup of FIG. 1 on a wafer unloaded at a conventional temperature to the Hg probe measurements on a wafer unloaded at a temperature in accordance with the present invention.

FIG. 2 is a diagram of a mercury (Hg) probe measurement as a function of the time during which the measurement takes place after the wafer is unloaded from the reactor. The y-axis represents the mercury probe measurement, and the x-axis represents the time the measurement occurs after the unloading of the wafer. FIG. 2 shows mercury probe measurements on epitaxial silicon wafers unloaded at variable unloading temperatures.

The final unloading temperatures used in the mercury probe measurements of FIG. 2 were about 100°, 300°, 500° and 900° C. In each case, the cooling step before the unload was lengthened to 12 minutes to maintain the same gas exposure. After the unloading of each wafer, the results were read immediately on the mercury probe over time. Another reading was taken one hour after the first measurement. Two minutes were required from the time the wafer was unloaded from the reactor to the time of the first measurement. After the completion of the last reading, the wafers were dipped in HF and brought back to the probe for reading. Since a mercury probe reading on epitaxial silicon wafers treated with HF has been proven to give accurate results, these results were compared to the initial readings taken directly on wafers after unloading from the reactor.

The diagram of FIG. 2 only shows measurements taken immediately after the wafers were taken out of the reactor, to keep the scale smaller. One might notice that the first measurement for each unload is low. This is a problem with the mercury probe that is consistently seen.

In FIG. 2, the readings of mercury probe measurement on the wafer unloaded at a temperature of about 900° C. are shown by curve 20. The readings on the wafer were immediately low, averaging about 0.6 ohm-cm. The expected value was greater then 1.5 ohm-cm. When readings on the wafer were attempted about one hour later, no measurements could be taken at all. This is believed to be an effect of an oxide. When the wafer was dipped and taken back to the probe, a reading of 1.74 ohm-cm was taken (data not shown on the diagram).

The readings of mercury probe measurement on the wafer unloaded at a temperature of about 500° C. are shown by curve 30. The readings on this wafer started out fairly stable, but after about three minutes, began to drop. One hour later, no readings could be taken from the wafer. Again, this was probably due to the growth of the oxide. After dipping, this wafer was also read at 1.74 ohm-cm (data not shown on the diagram).

The readings of mercury probe measurement on the wafer unloaded at temperature of about 300° C. are shown by curve 40. The readings on this wafer remained stable from the beginning. One hour after the first reading, the measurement was still stable. Before being etched the next day, the wafer was measured again. The reading had dropped some, but a measurement could still be taken. After this, the wafer was dipped, and produced a reading of 1.71 (data not shown on the diagram). This value is a little higher than that on the diagram, but that is probably due to a difference in calibration from day to day.

The readings of mercury probe measurement on the wafer unloaded at a temperature of about 100° C. are shown by curve 50. This wafer acted identically with the wafer unloaded at about 300° C. After dipping, the wafer produced a reading of 1.448 (data not shown on the diagram). Again, this is a little higher then the day before, but it shows the same trend as the 300° C. unload.

Therefore, the test depicted in FIG. 2 demonstrates that when the unloading temperature of the silicon wafer is about or below 500° C., an accurate C-V measurement can be taken on the silicon wafer without chemical processing.

Figure 3:
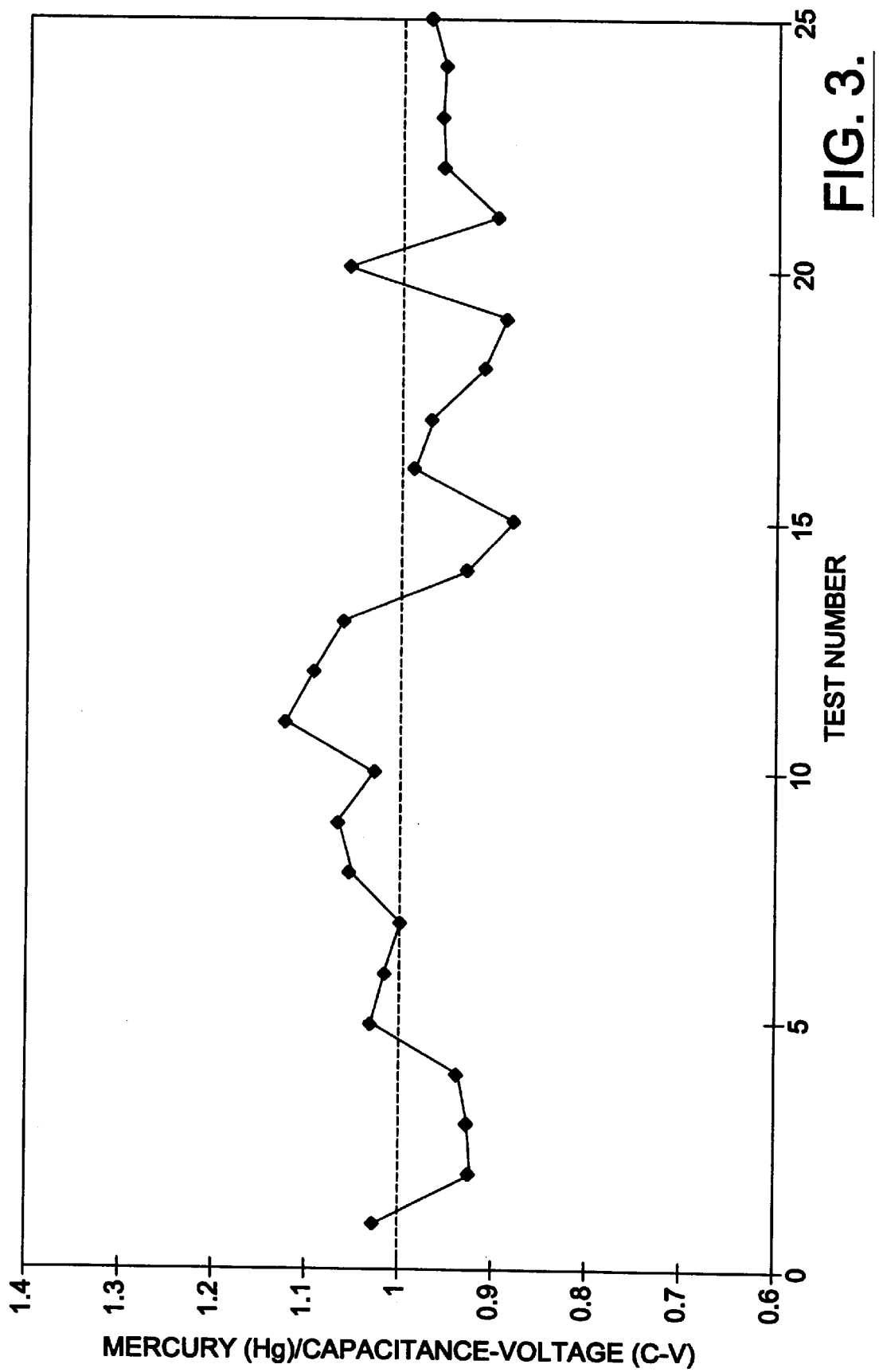
FIG. 3 is a diagram showing the ratio of mercury (Hg) measurements to capacitance-voltage (C-V) measurements in accordance with the present invention.

FIG. 3 is a diagram showing the ratio of the mercury measurement (Hg) to capacitance-voltage (C-V) measurement. The accuracy of the mercury probe is measured by comparing to the CV measurement—a measurement commonly used in the industry for guaranteeing the quality of wafer products. It would be ideal if the mercury probe closely correlated to the CV measurements, although it is understood that CV measurements unfortunately can vary up to 10%.

In a test depicted by FIG. 3, 25 different wafers were tested with a mercury probe with the 300° C. unload program. Five measurement points were taken on each wafer. This diagram of FIG. 3 only depicts the measurement point in the center of each wafer. The y-axis represents the ratio of the mercury probe measurement to the C-V measurement, and the x-axis represents the number of the tested wafers. If the ratio of the mercury probe measurement to the C-V measurement were the same, the ratio would be 1.

FIG. 3 shows that the ratio stays within a range of 0.9–1.1. This is approximately the variation that a CV measurement will undergo. Any additional differences can be accounted for by a difference in calibration. The mercury probe must undergo a daily calibration that can be difficult to maintain.

In light of all this, the diagram of FIG. 3 indicates that the difference between mercury probe measurements and CV measurements seems small and the mercury probe is fairly accurate using this unload program.

The foregoing is meant to illustrate, but not to limit, the scope of the invention. Indeed, those of ordinary skill in the art can readily envision and produce further embodiments, based on the teachings herein, without undue experimentation.

The present invention may be embodied in other specific forms without departing from its essential characteristics. The described embodiment is to be considered in all respects only as illustrative and not as restrictive. The scope of the invention is, therefore, indicated by the appended claims rather than by the foregoing description. All changes which come within the meaning and range of the equivalence of the claims are to be embraced within their scope.

What is claimed is:

1. A method for preparing an epitaxial silicon wafer in a reactor, the method comprising the steps of:
    (a) depositing an epitaxial layer on a surface of a silicon wafer contained in the reactor at an elevated temperature;
    (b) purging the reactor with hydrogen after the epitaxial deposition;
    (c) cooling the reactor to an appropriate temperature greater than room temperature but no greater than 500° C. which allows hydrogen passivation of the surface of the epitaxial layer;
    (d) transferring the silicon wafer from the reactor while the reactor is maintained at the appropriate temperature to a wafer handling chamber; and (e) purging the wafer handling chamber with nitrogen to further cool the silicon wafer to room temperature, wherein the hydrogen passivation of the surface of the epitaxial layer prevents the formation of an oxide layer on the surface of the epitaxial layer for a sufficient amount of time to allow an accurate measurement of a carrier density profile of the epitaxial silicon wafer.

2. The method of claim 1, further comprising a step of measuring the carrier density profiles of the silicon wafer.

3. The method of claim 2, wherein said measuring step is carried out by capacitance-voltage measurements with a mercury probe instrument.

4. The method of claim 3, wherein said measuring step further comprises a step of forming a Schottky contact on the surface of the epitaxial layer.

5. The method of claim 1, wherein said appropriate temperature of step (c) of claim 1 is no greater than about 300° C. and wherein said sufficient amount of time is up to about 24 hours.

6. The method of claim 3, wherein said appropriate temperature of step (c) of claim 1 is about 500° C. and wherein said sufficient amount of time is up to 10 minutes.

7. A method for preparing an epitaxial silicon wafer in a reactor, the method comprising the steps of:

(a) depositing an epitaxial layer on a surface of a silicon wafer contained in the reactor at an elevated temperature;

(b) purging the reactor with hydrogen after the epitaxial deposition;

(c) cooling the reactor to an appropriate temperature greater than room temperature but not greater than 500° C. which allows hydrogen passivation of the surface of the epitaxial layer;

(d) unloading the epitaxial silicon wafer from the reactor while the reactor is maintained at the appropriate temperature;

(e) flushing the epitaxial silicon wafer with nitrogen gas to further cool the epitaxial silicon wafer to room temperature; and (f) measuring the carrier density profile of the epitaxial silicon wafer, wherein the hydrogen passivation of the surface of the epitaxial layer prevents the formation of an oxide layer for a period of time such that the carrier density profile is accurately measured.

8. The method of claim 7, wherein said measuring step is carried out by capacitance-voltage measurements with a mercury probe instrument.

9. The method of claim 8, wherein said measuring step further comprises a step of forming a Schottky contact on the surface of the epitaxial layer of the epitaxial silicon wafer.

10. The method of claim 7, wherein said appropriate temperature is no greater than about 300° C. and wherein said sufficient amount of time is up to about 24 hours.

11. The method of claim 7, wherein said appropriate temperature is about 500° C. and wherein said sufficient amount of time is up to about 10 minutes.

12. A method for preparing an epitaxial silicon wafer in a reactor, the method comprising the steps of:

(a) depositing an epitaxial layer on a surface of a silicon wafer contained in the reactor at an elevated temperature;

(b) purging the reactor with hydrogen after the epitaxial deposition;

(c) cooling the reactor to an appropriate temperature greater than room temperature but not greater than 500° C., which allows hydrogen passivation of the surface of the epitaxial layer such that the formation of an oxide layer on the surface of the epitaxial layer is prevented for a sufficient amount of time to allow an accurate measurement of a carrier density profile of the epitaxial silicon wafer;

(d) unloading the epitaxial silicon wafer from the reactor while the reactor is maintained at the appropriate temperature;

(e) flushing the epitaxial silicon wafer with nitrogen gas to further cool down the temperature of the wafer from the appropriate temperature to room temperature; and (f) measuring the carrier density profile of the epitaxial silicon wafer by capacitance-voltage measurements with a mercury probe.

13. The method of claim 12, wherein said appropriate temperature of step (c) is no greater than about 300° C. and wherein said sufficient amount of time is up to about 24 hours.

14. The method of claim 12, wherein said sufficient amount of time is up to 10 minutes.

15. The method of claim 12 wherein said unloading step comprises transferring the silicon wafer from the reactor while the reactor is maintained at the appropriate temperature to a wafer handling chamber, and wherein said flushing step comprises purging the wafer handling chamber with nitrogen to further cool the silicon wafer to room temperature.

* * * * *